(12) United States Patent
Lee

(10) Patent No.: US 11,296,694 B2
(45) Date of Patent: Apr. 5, 2022

(54) OUTPUT DRIVING CIRCUIT

(71) Applicant: SK hynix Inc., Icheon (KR)

(72) Inventor: Seung Ho Lee, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/076,474

(22) Filed: Oct. 21, 2020

(65) Prior Publication Data
US 2021/0409019 A1    Dec. 30, 2021

(30) Foreign Application Priority Data

Jun. 29, 2020  (KR) .................. 10-2020-0079223

(51) Int. Cl.
| | | |
|---|---|---|
| *H03K 3/00* | (2006.01) | |
| *H02J 7/34* | (2006.01) | |
| *H03K 17/687* | (2006.01) | |
| *H03K 3/356* | (2006.01) | |
| *H03K 19/20* | (2006.01) | |

(52) U.S. Cl.
CPC ... *H03K 17/6872* (2013.01); *H03K 3/356113* (2013.01); *H03K 19/20* (2013.01)

(58) Field of Classification Search
CPC ......... H03K 17/6872; H03K 3/356113; H03K 19/20; H02J 7/34
USPC ........................................................ 327/109
See application file for complete search history.

(56) References Cited

U.S. PATENT DOCUMENTS

| | | | | |
|---|---|---|---|---|
| 5,736,869 A | * | 4/1998 | Wei ................. | H03K 19/00315 326/81 |
| 7,005,913 B2 | * | 2/2006 | Diffenderfer .... | H03K 19/00315 327/323 |
| 7,205,819 B2 | * | 4/2007 | Davis ................ | H03K 19/0016 326/63 |
| 8,212,590 B2 | | 7/2012 | Wang et al. | |
| 8,994,412 B2 | * | 3/2015 | Kim ............... | H03K 19/018521 327/109 |
| 9,893,517 B2 | | 2/2018 | Dey et al. | |
| 10,027,325 B1 | * | 7/2018 | Graves ............. | H03K 17/6872 |
| 10,305,474 B2 | * | 5/2019 | Lee ............... | H03K 19/017509 |
| 10,348,301 B2 | | 7/2019 | Lee | |
| 10,511,304 B2 | | 12/2019 | Pan et al. | |
| 10,659,047 B2 | | 5/2020 | Lee | |
| 10,848,154 B2 | * | 11/2020 | Lee ................. | H03K 19/01721 |

(Continued)

FOREIGN PATENT DOCUMENTS

KR    1020180128600 A    12/2018

OTHER PUBLICATIONS

Vinod Kumar et al., "Power Sequence free 400Mbps 90μW 6000μm2 1.8V-3.3V Stress Tolerant I/O Buffer in 28nm CMOS," IEEE, 2013, 4 pages.

(Continued)

*Primary Examiner* — Ryan Jager

(57) ABSTRACT

An output driving circuit may include a pull-up-pull-down driver connected to a pad, a level shifter operating based on a first power voltage and a second power voltage that is greater than the first power voltage, level shifting a data signal to generate a first control signal, and applying the first control signal to the pull-up-pull-down driver, and a driver control logic operating based on the first power voltage, generating a second control signal based on the data signal, and applying the second control signal to the pull-up-pull-down driver.

19 Claims, 12 Drawing Sheets

(56) References Cited

U.S. PATENT DOCUMENTS

| | | |
|---|---|---|
| 2010/0176848 A1 | 7/2010 | Du et al. |
| 2010/0271118 A1 | 10/2010 | Bhattacharya et al. |
| 2011/0025380 A1 | 2/2011 | Kim et al. |
| 2018/0316185 A1 | 11/2018 | Lai et al. |

OTHER PUBLICATIONS

Marcs NG, "3.3V Transmitter Using 1.8V Transistors In A Cascode Configuration," 2013, 48 pages, Digital Commons, Paper 2056, Ryerson University.

Karthik Rajagopal et al., "An Enhanced Topology for Reliability of a High Performance 3.3V I/O Buffer in a Single-well Bulk CMOS 1.8v-oxide Low voltage Process,"10th Int'l Symposium on Quality Electronic Design, 2009, 4 pages, IEEE.

Karthik Rajagopal et al., "Dynamically Biased Low Power High Performance 3.3V Output Buffer in a Single Well Bulk CMOS 1.8V Oxide 45nm Process," 2012, 6 pages, IEEE.

Office Action dated Jun. 14, 2021 issued for related U.S. Appl. No. 17/073,964.

* cited by examiner

OUTPUT DRIVING CIRCUIT

CROSS-REFERENCE TO RELATED APPLICATION

The present application claims priority under 35 U.S.C. § 119(a) to Korean patent application number 10-2020-0079223, filed on Jun. 29, 2020, in the Korean Intellectual Property Office, the entire disclosure of which is incorporated herein by reference.

BACKGROUND

Field of Invention

The present disclosure relates to an electronic device, and more particularly, to an output driving circuit and a semiconductor device including the same.

Description of Related Art

In a recent chip, a high-speed interface IP, which requires a low power voltage and a high-speed operation, is commonly used. Accordingly, an operation voltage of an element configuring an operation circuit in the chip is gradually lowered. For example, as an operation voltage for driving the existing chip, 1.8V was widely used, but for a high speed operation and low power consumption, an operation voltage of 1.2V is also gradually used.

That is, as an operation speed of a semiconductor memory increases, an operation voltage lower than the existing operation voltage is desirable for reducing one or more of power consumption, noise, and an input/output pad capacitance. Accordingly, an output driving circuit capable of a reliable operation even at a low operation voltage has been developed.

SUMMARY

An embodiment of the present disclosure provides an output driving circuit capable of increasing reliability during a high-speed operation.

An output driving circuit according to an embodiment of the present disclosure may include a pull-up-pull-down driver connected to a pad, a level shifter operating based on a first power voltage and a second power voltage that is greater than the first power voltage, level shifting a data signal to generate a first control signal, and applying the first control signal to the pull-up-pull-down driver, and a driver control logic operating based on the first power voltage, generating a second control signal based on the data signal, and applying the second control signal to the pull-up-pull-down driver.

Embodiments of the present disclosure may provide an output driving circuit capable of increasing reliability during a high-speed operation.

DETAILED DESCRIPTION

Specific structural or functional descriptions of embodiments according to the concept which are disclosed in the present specification or application are illustrated only to describe embodiments according to the concept of the present disclosure. The embodiments according to the concept of the present disclosure may be carried out in various forms and the descriptions are not limited to the embodiments described in the present specification or application.

As an operation speed of a semiconductor device increases, a driving voltage of the semiconductor device also decreases. For example, an interface voltage used as input/output power of the semiconductor device is changing from 1.8V to 1.2V. When the interface voltage is decreased, power consumption, noise, and a pad capacitance of the semiconductor memory device may be reduced.

For example, between the semiconductor memory device and a memory controller controlling the semiconductor memory device, when 1.2V is used as the interface voltage, a difference between the interface voltage and an interval voltage is decreased compared to a case where 1.8V is used as the interface voltage. When a 0.8V device (e.g., a thin gate oxide device) is used instead of a 1.8V device (e.g., a medium gate oxide device), significant benefits may be obtained in terms of power consumption, the area, and a pad capacitance.

In order to configure an input/output interface of the semiconductor memory device with the thin gate oxide device operating at 0.8V, reliability of the 0.8V device needs to be secured even while operating at a voltage of 1.2V. Accordingly, a structure of an input/output driving circuit capable of a high-speed operation and securing reliability of a thin gate oxide film device is desirable.

Figure 1:
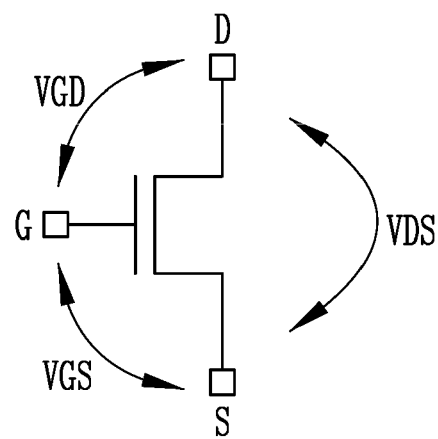
FIG. 1 is a diagram for describing an operation condition of a thin gate oxide device.

FIG. 1 is a diagram for describing an operation condition of a thin gate insulator device (e.g., a thin gate oxide device) 100.

In order for the thin gate oxide device 100 to stably operate, a gate-source voltage VGS, a gate-drain voltage VGD, and a drain-source voltage VDS of the thin gate oxide device are required to satisfy reliability condition. For example, when the thin gate oxide device 100 is a device for 0.8V operation, reliability of an element is secured the gate-source voltage VGS, the gate-drain voltage VGD, and the drain-source voltage VDS operate at 1.06V or less. Accordingly, the reliability condition as shown in [Table 1] may be derived.

TABLE 1

| Voltage Difference | Reliability condition |
|---|---|
| $V_{GD}$ | $V_{GD} \leq 1.06$ V |
| $V_{GS}$ | $V_{GS} \leq 1.06$ V |
| $V_{DS}$ | $V_{DS} \leq 1.06$ V |

Figure 2:
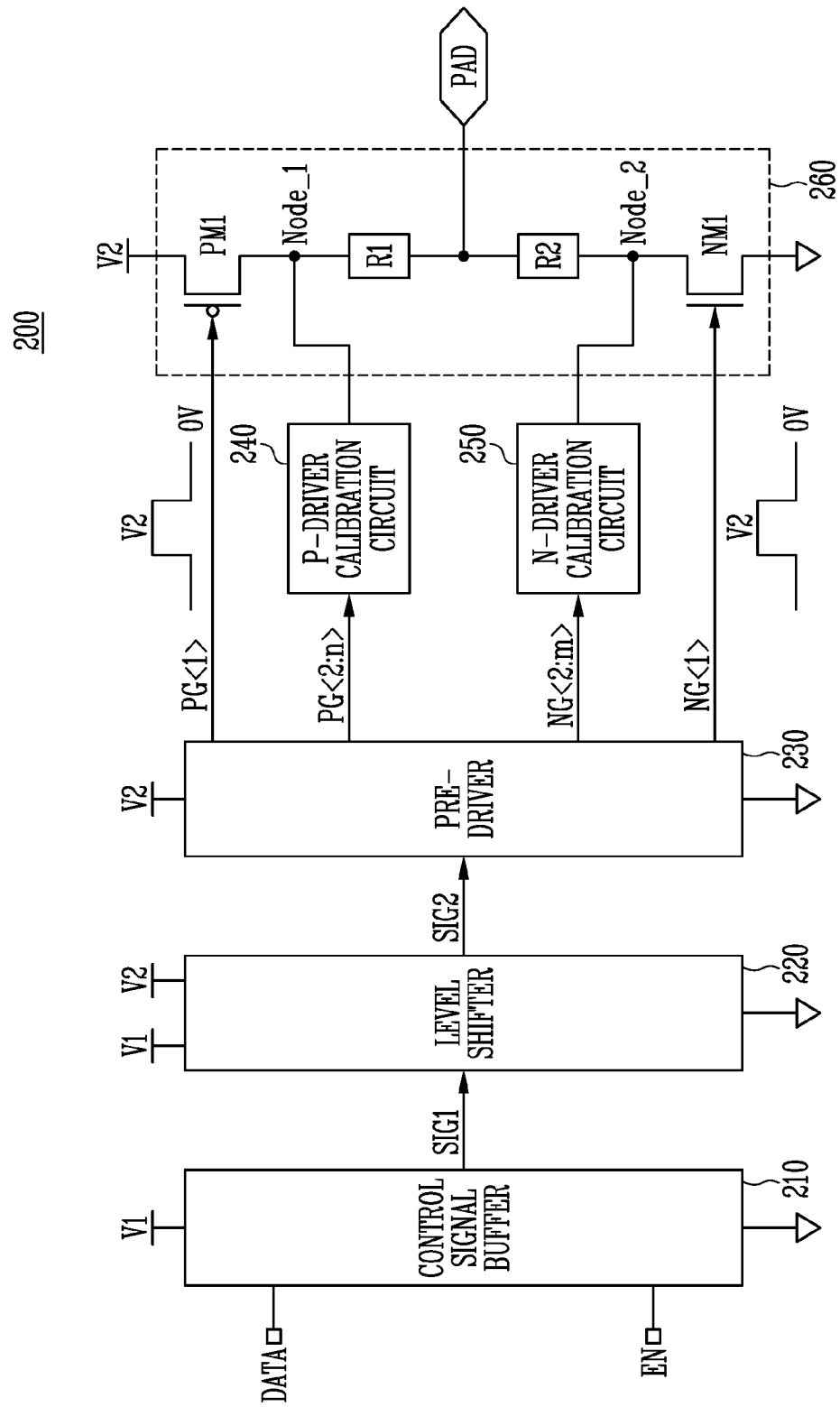
FIG. 2 is a circuit diagram illustrating an output driving circuit according to an embodiment of the present disclosure.

FIG. 2 is a circuit diagram illustrating an output driving circuit 200 according to an embodiment of the present disclosure.

Referring to FIG. 2, the output driving circuit 200 includes a control signal buffer 210, a level shifter 220, a pre-driver 230, a first driver calibration circuit (e.g., a P-driver calibration circuit) 240, a second driver calibration circuit (e.g., an N-driver calibration circuit 250), and a driver (e.g., a pull-up-pull-down driver) 260. The pull-up-pull-down driver 260 includes a PMOS transistor PM1, an NMOS transistor NM1, a first resistor R1, and a second resistor R2. The control signal buffer 210 receives a data signal DATA and an enable signal EN, and outputs a first signal SIG1. The control signal buffer 210 may be operated by a first power voltage V1. Therefore, the first signal SIG1 may be a signal having a voltage range between 0V and the first power voltage V1. In an embodiment, the first power voltage V1 may be a voltage having any value in a range of 0.8V to 1V.

The level shifter 220 receives the first signal SIG1 and level-shifts the first signal SIG1 to generate a second signal SIG2. The level shifter 220 may be operated by the first power voltage V1 and a second power voltage V2. The second power voltage V2 may be an external voltage having a value greater than the first power voltage V1. The first power voltage V1 may be an internal voltage. Therefore, the second signal SIG2 may be a signal having a voltage range between 0V and the second power voltage V2. In an embodiment, the second power voltage V2 may be a voltage having any value in a range of 1.2V to 1.8V.

The pre-driver 230 outputs a plurality of PMOS gate signals PG<1:n> and a plurality of NMOS gate signals NG<1:m> based on the second signal SIG2. A first PMOS gate signal PG<1> among the PMOS gate signals PG<1:n> is applied to the PMOS transistor PM1. Second to n-th PMOS gate signals PG<2:n> among the PMOS gate signals PG<1:n> are applied to the P-driver calibration circuit 240. A first NMOS gate signal NG<1> among the NMOS gate signals NG<1:n> is applied to the NMOS transistor NM1. Second to n-th NMOS gate signals NG<2:n> among the NMOS gate signals NG<1:n> are applied to the N-driver calibration circuit 250. That is, the pre-driver 230 may output the PMOS gate signals PG<1:n> and the NMOS gate signals NG<1:m> of a code form.

The P-driver calibration circuit 240 may be a circuit for calibrating an impedance of a first node NODE_1. An embodiment of the P-driver calibration circuit 240 is described later with reference to FIG. 3A. Meanwhile, the N-driver calibration circuit 250 may be a circuit for calibrating an impedance of a second node NODE_2. An embodiment of the N-driver calibration circuit 250 is described later with reference to FIG. 3B.

Meanwhile, the pre-driver 230 may operate by the second power voltage V2. Therefore, the PMOS gate signals PG<1:n> and the NMOS gate signals NG<1:m> may be signals each having a voltage range between 0V and the second power voltage V2. In particular, as shown in FIG. 2, the first PMOS gate signal PG<1> applied to the PMOS transistor PM1 and the first NMOS gate signal NG<1> applied to the NMOS transistor NM1 may be signals having a voltage range between 0V and the second power voltage V2.

Therefore, in the output driving circuit 200 shown in FIG. 2, the PMOS transistor PM1 and the NMOS transistor NM1 connected through a pad and the first and second resistors R1 and R2 may not be implemented as a thin gate oxide device satisfying the condition of [Table 1]. Instead, the PMOS transistor PM1 and the NMOS transistor NM1 shown in the output driving circuit 200 of FIG. 2 may be implemented as a medium gate oxide device or a thick gate oxide device.

Figure 3A:
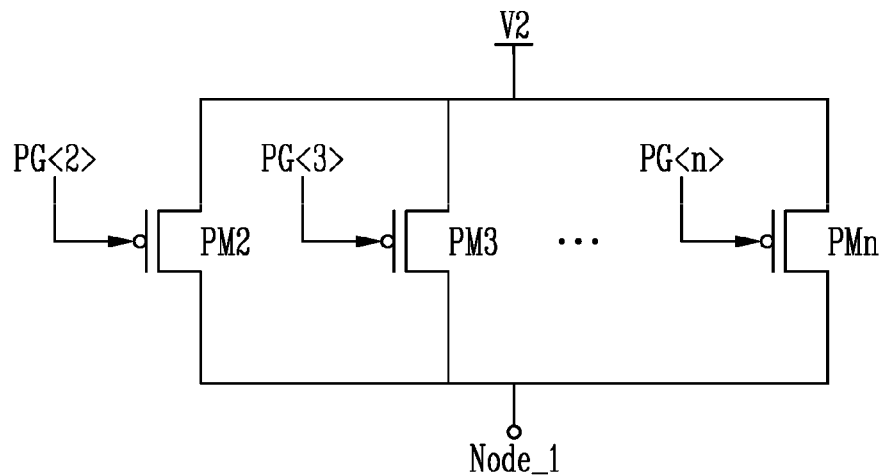
FIG. 3A is a circuit diagram illustrating a P-driver calibration circuit according to an embodiment of the present disclosure.

FIG. 3A is a circuit diagram illustrating a P-driver calibration circuit 240a suitable for use as the P-driver calibration circuit 240 of FIG. 2, according to an embodiment of the present disclosure. Referring to FIG. 3A, the P-driver calibration circuit includes second to n-th PMOS transistors PM2 to PMn. The second to n-th PMOS transistors PM2 to PMn may be connected in parallel between the second power voltage V2 and the first node NODE_1. Meanwhile, the second to n-th PMOS gate signals PG<2:n> may be applied to gate terminals of the second to n-th PMOS transistors PM2 to PMn. Accordingly, the impedance of the first node NODE_1 may be calibrated by the second to n-th PMOS gate signals PG<2:n> output in the code form.

Figure 3B:
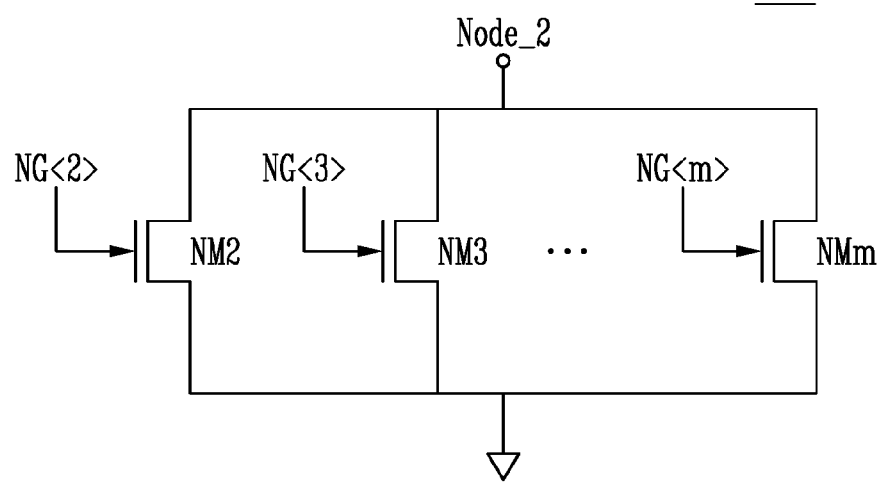
FIG. 3B is a circuit diagram illustrating an N-driver calibration circuit according to an embodiment of the present disclosure.

FIG. 3B is a circuit diagram illustrating an N-driver calibration circuit 250a suitable for use as the N-driver calibration circuit 250 of FIG. 2, according to an embodiment of the present disclosure. Referring to FIG. 3B, the N-driver calibration circuit includes second to m-th NMOS transistors NM2 to NMm. The second to m-th NMOS transistors NM2 to NMm may be connected in parallel between the second node NODE_2 and a ground. Meanwhile, the second to m-NMOS gate signals NG<2:m> may be applied to gate terminals of the second to m-th NMOS transistors NM2 to NMm. Accordingly, the impedance of the second node NODE_2 may be calibrated by the second to m-th NMOS gate signals NG<2:m> output in the code form.

Figure 4:
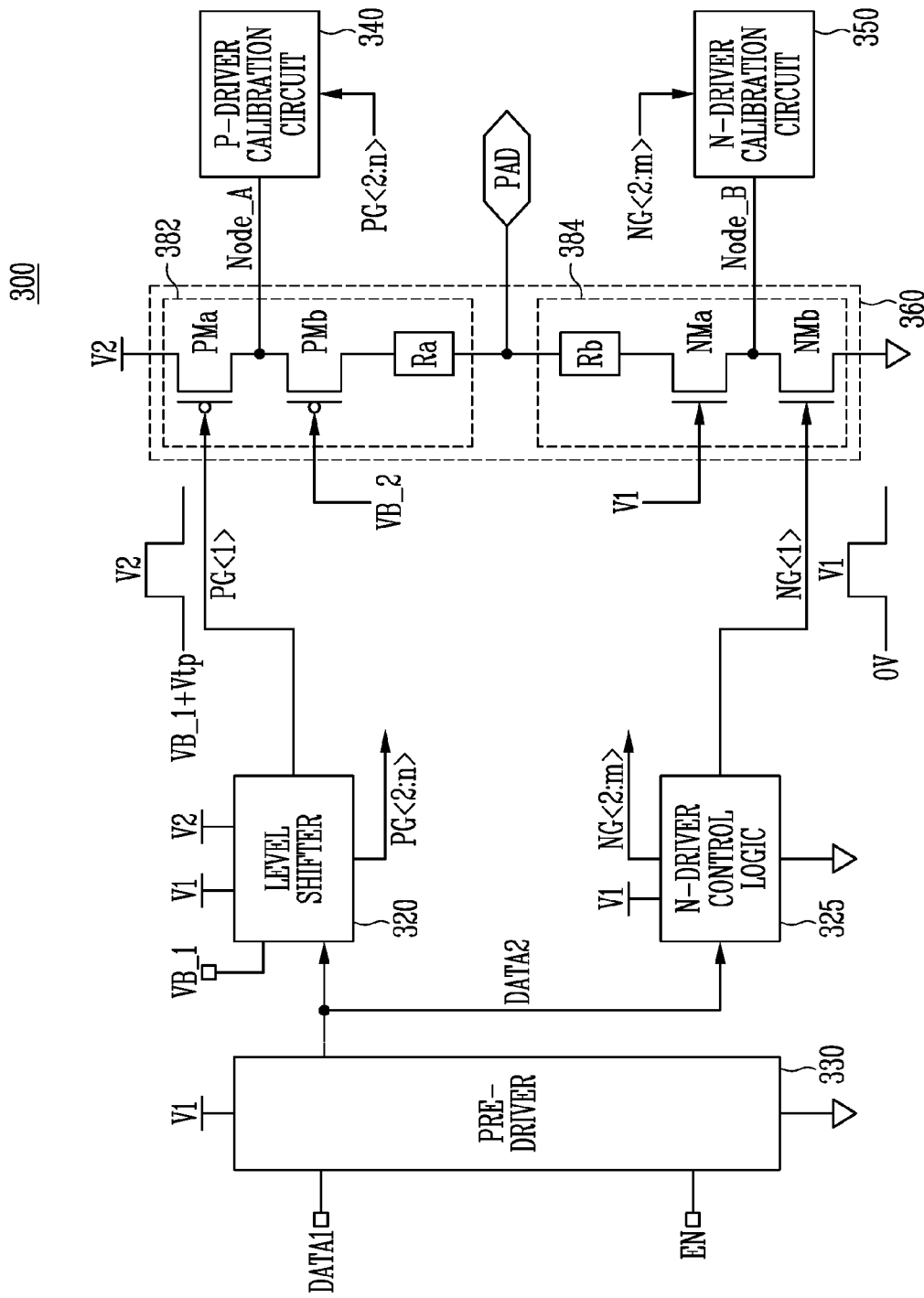
FIG. 4 is a block diagram illustrating an output driving circuit 300 according to another embodiment of the present disclosure.

FIG. 4 is a block diagram illustrating an output driving circuit 300 according to another embodiment of the present disclosure.

Referring to FIG. 4, the output driving circuit 300 may include a pre-driver 330, a level shifter 320, a driver control logic (e.g., an N-driver control logic) 325, a first driver calibration circuit (e.g., a P-driver calibration circuit) 340, a second driver calibration circuit (e.g., an N-driver calibration circuit) 350, and a pull-up-pull-down driver (or a pull-up-down driver) 360. The pull-up-pull-down driver 360 includes a first PMOS transistor PMa, a second PMOS transistor PMb, a first NMOS transistor Nma, a second NMOS transistor NMb, a first resistor Ra, and a second resistor Rb. For example, the pull-up-pull-down driver 360 include a pull-up driver 382 and a pull-down driver 384, such that the pull-up driver 382 includes the first PMOS transistor PMa, the second PMOS transistor PMb, the first resistor Ra, and the pull-down driver 384 includes the first NMOS transistor Nma, the second NMOS transistor NMb, and the second resistor Rb. The P-driver calibration circuit 340 is connected to a node NODE_A of the pull-up-pull-down driver 360. The N-driver calibration circuit 350 is connected to a node NODE_B of the pull-up-pull-down driver 360.

In FIG. 4, the P-driver calibration circuit 340 and the N-driver calibration circuit 350 may be substantially the same as the P-driver calibration circuit 240a and the N-driver calibration circuit 250a shown in FIGS. 3A and 3B, respectively. Therefore, repetitive description of the P-driver calibration circuit 340 and the N-driver calibration circuit 350 is omitted.

In a case of the output driving circuit 200 shown in FIG. 2, the level shifter 220 and the pre-driver 230 may operate by the second power voltage V2. On the other hand, in a structure of the output driving circuit 300 shown in FIG. 4, most of circuits except for the level shifter 320 driving the first PMOS transistor PMa may operate by the relatively low first power voltage V1. Therefore, in a case of the output driving circuit 300 shown in FIG. 4, power consumption may be reduced compared to the output driving circuit 200 shown in FIG. 2.

The pre-driver 330 may receive a first data signal DATA1 and the enable signal EN, and output a second data signal DATA2. The pre-driver 330 may operate by the first power voltage V1. Therefore, the second data signal DATA2 may be a signal having a voltage range between 0V and the first power voltage V1. In an embodiment, the first power voltage V1 may be a voltage having a value in a range of 0.8V to 1V. The second data signal DATA2 may be a signal indicating data substantially the same as the first data signal DATA1. However, the second data signal DATA2 may be a signal of which a voltage range is determined by the first power voltage V1.

The level shifter 320 operates based on the first and second power voltages V1 and V2, and receives the second data signal DATA2. The level shifter 320 outputs a first control signal (e.g., the first PMOS gate signal) PG<1> based on a first bias voltage VB_1. In an embodiment, the level shifter 320 may output the first PMOS gate signal PG<1> having a value sufficient to keep a voltage difference between a control terminal (e.g., a gate terminal) and a first end terminal (e.g., a source terminal) of the first PMOS transistor PMa, a voltage difference between the control terminal and a second end terminal (e.g., a drain terminal) of the first PMOS transistor PMa, and a voltage difference between the second end terminal and the first end terminal of the first PMOS transistor PMa equal to or less than a given value (e.g., 1.06V in Table 1). For example, the level shifter 320 according to an embodiment of the present disclosure may output the first PMOS gate signal PG<1> having a voltage range of a voltage (VB_1+Vtp) to the second power voltage V2. Therefore, the gate-source voltage VGS, the gate-drain voltage VGD, and the drain-source voltage VDS of the first PMOS transistor PMa satisfy the reliability condition described by [Table 1]. The voltage Vtp may be a threshold voltage value of a PMOS transistor included in the level shifter 320.

Meanwhile, the level shifter 320 outputs the second to n-th PMOS gate signals PG<2:n> based on the first bias voltage VB_1. Similarly to the first PMOS gate signal PG<1>, the level shifter 320 may output the second to n-th PMOS gate signals PG<2:n> each having a voltage range of (VB_1+Vtp) to V2. The level shifter 320 may generate the second to n-th PMOS gate signals PG<2:n> as a calibration control signal for controlling the P-driver calibration circuit 340.

An embodiment of the level shifter 320 of FIG. 4 is described later with reference to FIG. 5.

Meanwhile, the N-driver control logic 325 operates based on the first power voltage V1 and receives the second data signal DATA2. The N-driver control logic 325 outputs a second control signal (e.g., the first NMOS gate signal) NG<1> based on the first power voltage V1. In an embodiment, the N-driver control logic 325 may output the first NMOS gate signal NG<1> having a value sufficient to keep a voltage difference between a control terminal (e.g., a gate terminal) and a first end terminal (e.g., a source terminal) of the second NMOS transistor NMb, a voltage difference between the control terminal and a second end terminal (e.g., a drain terminal) of the second NMOS transistor NMb, and a voltage difference between the second end terminal and the first end terminal of the second NMOS transistor NMb equal to or less than a given value (e.g., 1.06V in Table 1). For example, the N-driver control logic 325 according to an embodiment of the present disclosure may output the first NMOS gate signal NG<1> having a voltage range of 0V to the first power voltage V1. Therefore, the gate-source voltage VGS, the gate-drain voltage VGD, and the drain-source voltage VDS of the second NMOS transistor NMb satisfy the reliability condition described by [Table 1]. For example, the gate-source voltage VGS of the second NMOS transistor NMB is kept equal to or less than the first power voltage V1, which is less than 1.06V. The N-driver control logic 325 according to an embodiment of the present disclosure may further generate the second to m-th NMOS gate signals NG<2:m> as a calibration control signal for controlling the N-driver calibration circuit 350.

A second bias voltage VB_2 is applied to a gate terminal of the second PMOS transistor PMb of the pull-up-pull-down driver 360. In addition, the first power voltage V1 is applied to a gate terminal of the first NMOS transistor NMa of the pull-up-pull-down driver 360.

The first bias voltage VB_1 and the second bias voltage VB_2 may have voltage values selected to satisfy the reliability condition of the thin gate oxide elements included in the output driving circuit 300. According to an embodiment, the first bias voltage VB_1 and the second bias voltage VB_2 may be input from the outside of the output driving circuit 300. In another embodiment, the first bias voltage VB_1 and the second bias voltage VB_2 may be generated internally in the output driving circuit 300. In this case, the first bias voltage VB_1 and the second bias voltage VB_2 may be generated internally by regulating the first power voltage V1 or the second power voltage V2. In this case, the output driving circuit 300 may further include a regulating circuit for generating the first bias voltage VB_1 or the second bias voltage VB_2.

Figure 5:
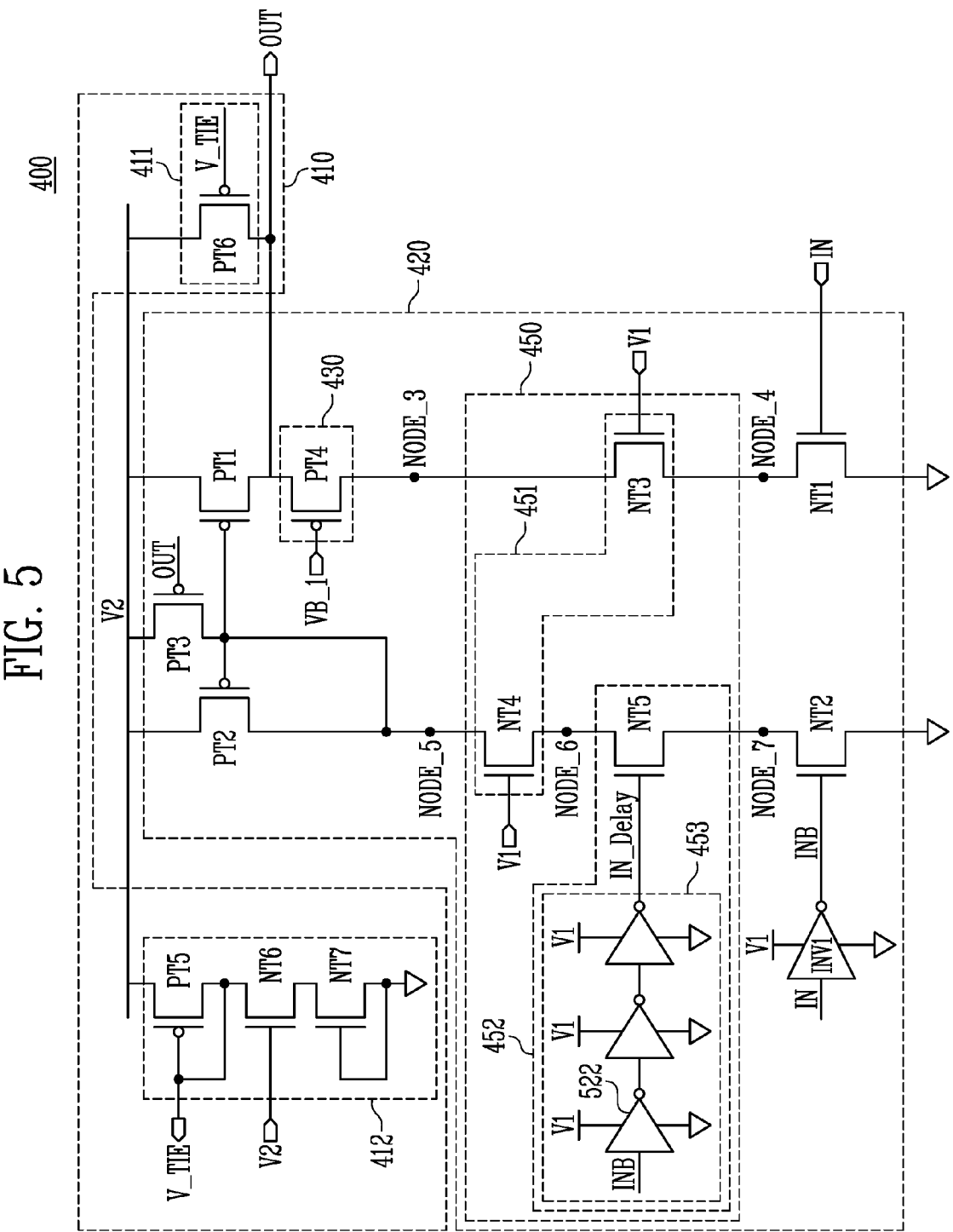
FIG. 5 is a diagram illustrating a configuration of a level shifter shown in FIG. 4 according to an embodiment of the present disclosure.

FIG. 5 is a diagram illustrating a configuration of a level shifter 400 suitable for use as the level shifter 320 shown in FIG. 4.

Referring to FIG. 5, the level shifter 400 may include a current mirror 420, a first adjustment circuit 430, and a second adjustment circuit 410.

The level shifter 400 according to an embodiment of the present disclosure may further include a third adjustment circuit 450.

Since elements (e.g., transistors) configuring the level shifter 400 use an operation voltage lower than the existing operation voltage, each of these elements may be designed as a thin gate oxide element. Therefore, an output driving circuit (e.g., the output driving circuit 300 in FIG. 4) including the level shifter 400 according to an embodiment of the present disclosure may operate at a high speed, and power consumption may be reduced compared to the output driving circuit 200 shown in FIG. 2.

The current mirror 420 may receive an input signal IN according to the first power voltage V1 and mirror a current corresponding to the second power voltage V2 according to a level of the input signal IN to generate an output signal OUT. The input signal IN may be the second data signal DATA2 shown in FIG. 4. In addition, the output signal OUT may be the first PMOS gate signal PG<1> shown in FIG. 4.

The second power voltage V2 may have a level higher than that of the first power voltage V1.

The current mirror 420 may include an inverter INV1 and a plurality of switching elements NT1, NT2, PT1, PT2, and PT3. The plurality of switching elements NT1, NT2, PT1, PT2, and PT3 may be implemented as transistors.

A first current path of the current mirror 420 may be formed by a plurality of switching elements PT1, PT4, NT3, and NT1.

A second current path of the current mirror 420 may be formed by a plurality of switching elements PT2, NT4, NT5, and NT2.

The first adjustment circuit 430 may be connected to a terminal of the output voltage OUT of the current mirror 420 and may be configured to adjust a voltage level of the terminal of the output voltage OUT according to the first bias voltage VB_1.

The first adjustment circuit 430 may include the switching element PT4.

The second adjustment circuit 410 may be connected to a terminal of the second power voltage V2 in parallel with the current mirror 420 and may be configured to adjust the voltage level of the terminal of the output voltage OUT of the current mirror 420.

The second adjustment circuit 410 may include an output voltage compensator 411 and a compensation voltage generator 412.

The output voltage compensator 411 may prevent the voltage level of the terminal of the output voltage OUT from being lower than the voltage level increased by the first adjustment circuit 430 according to a compensation voltage V_TIE.

The compensation voltage generator 412 may be connected to the terminal of the second power voltage V2 in parallel with the current mirror 420 to generate the compensation voltage V_TIE.

The second adjustment circuit 410 may include a plurality of switching elements PT5, PT6, NT6, and NT7.

The third adjustment circuit 450 may be connected to the first current path and the second current path of the current mirror 420, and may be configured to adjust a voltage level of the first current path and the second current path and block a leakage current.

The third adjustment circuit 450 may include a first adjuster 451 and a second adjuster 452.

The first adjuster 451 may adjust the voltage level of the first current path and the second current path of the current mirror 420 according to the first power voltage V1.

The second adjuster 452 may block the leakage current of the second current path of the current mirror 420 according to the input signal IN. The second adjuster 452 may include a delay circuit 453.

The third adjustment circuit 450 may include the delay circuit 453 and a plurality of switching elements NT3, NT4, and NT5.

For example, assuming that the first power voltage V1 is 0.8V and the second power voltage V2 is 1.2 V, in order to secure the reliability of all elements configuring the level shifter 400, node voltage differences Vds, Vgs, and Vg are required to remain, for example, 1.06V or less, in any operation condition.

Therefore, the level shifter 400 according to the embodiment shown in FIG. 5 is designed to satisfy the above-described node voltage difference condition using the first adjustment circuit 430 and the second adjustment circuit 410, and additionally, the third adjustment circuit 450 of the level shifter 400 is configured to improve stability and a leakage current prevention function.

The first switching element NT1 may include one end connected to a ground terminal, another end connected to a node NODE_4, and a control end receiving the input signal IN.

At this time, one end of the plurality of switching elements NT1, NT2, PT1, PT2, and PT3 may be a source or a drain, another end may be a drain or a source, and a control end may be a gate.

The inverter INV1 may invert the input signal IN to generate an inverted input signal INB.

The second switching element NT2 may include one end connected to the ground terminal, another end connected to a node NODE_7, and a control end receiving the inverted input signal INB.

The third switching element PT1 may include one end connected to the terminal of the second power voltage V2 and another end connected to the terminal of the output voltage OUT.

The fourth switching element PT2 may include one end connected to the terminal of the second power voltage V2 and another end connected to a node NODE_5.

The fifth switching element PT4 may include one end connected to the terminal of the output voltage OUT, another end connected to a node NODE_3, and a control end receiving the first bias voltage VB_1.

The first bias voltage VB_1 may be, for example, 0.12V.

Since the fifth switching element PT4 receives the first bias voltage VB_1 through the control end, for example, the gate, in an AC operation, the output voltage OUT may have a variation range corresponding to VB_1+Vth_PT4 to V2, and in a DC operation, the output voltage OUT may be fixed to VB_1+Vth_PT4 or V2, Vth_PT4 denoting a threshold voltage of the fifth switching element PT4. Therefore, the above-described node voltage difference condition may be satisfied. The voltage Vtp shown in FIG. 4 may be a threshold voltage Vth_PT4 of the switching element PT4. That is, the first PMOS gate signal PG<1> shown in FIG. 4 has the variation range corresponding to VB_1+Vth_PT4 to V2.

The sixth switching element PT6 may include one end connected to the terminal of the second power voltage V2, another end connected to the terminal of the output voltage OUT, and a control end receiving the compensation voltage V_TIE.

The seventh to ninth switching elements PT5, NT6, and NT7 may be connected between the terminal of the second power voltage V2 and the ground terminal, and may generate the compensation voltage V_TIE according to the second power voltage V2.

Current mirroring of the sixth switching element PT6 may be performed according to the compensation voltage V_TIE generated by the seventh to ninth switching elements PT5, NT6, and NT7, and a current according thereto may be supplied to the terminal of the output voltage OUT.

Since the sixth switching element PT6 continuously supplies the current to the terminal of the output voltage OUT, the output voltage OUT may be prevented from being lower than VB_1+Vth_PT4 even though the input signal IN of a high level is input to the control end of the first switching element NT1.

The sixth switching element PT6 prevents the output voltage OUT from being lower than VB_1+Vth_PT4, and thus operation reliability of the third switching element PT1 may be secured.

The tenth switching element NT3 includes one end connected to the node NODE_3, another end connected to the node NODE_4, and a control end receiving the first power voltage V1.

Since the tenth switching element NT3 receives the first power voltage V1 through the control end, operation reliability of the first switching element NT1 may be secured by lowering a voltage of the node NODE_4 by V1−Vth_NT3, Vth_NT3 denoting a threshold voltage of the tenth switching element NT3.

The eleventh switching element NT4 includes one end connected to the node NODE_5, another end connected to a node NODE_6, and a control end receiving the first power voltage V1.

The eleventh switching element NT4 may also operate in the same manner as the tenth switching element NT3 to secure an operation reliability of the twelfth switching element NT5, which is described later.

The delay circuit 453 may be implemented as an inverter array 453 including a plurality of inverters 522.

The inverter array 453 may delay and invert the inverted input signal INB to generate a delayed input signal IN_Delay.

The twelfth switching element NT5 includes one end connected to the node NODE_6, another end connected to the node NODE_7, and a control end receiving the delayed input signal IN_Delay.

The twelfth switching element NT5 may operate at a time difference from the second switching element NT2 according to the delayed input signal IN_Delay to minimize the leakage current by preventing a current path from being formed for more than a time required for a level transition of the terminal of the output voltage OUT. For example, the twelfth switching element NT5 may be turned on a given time interval after the second switching element NT2 has been turned on, the given time interval corresponding to the delay amount of the delay circuit 453.

FIG. 5 shows the configuration of the level shifter 400 generating the output signal OUT corresponding to the first PMOS gate signal PG<1> in FIG. 4. However, embodiments of the present disclosure are not limited thereto. A level shifter according to an embodiment of the present disclosure may also generate the second to n-th PMOS gate signals PG<2:n> identically to the first PMOS gate signal PG<1>.

Figure 6:
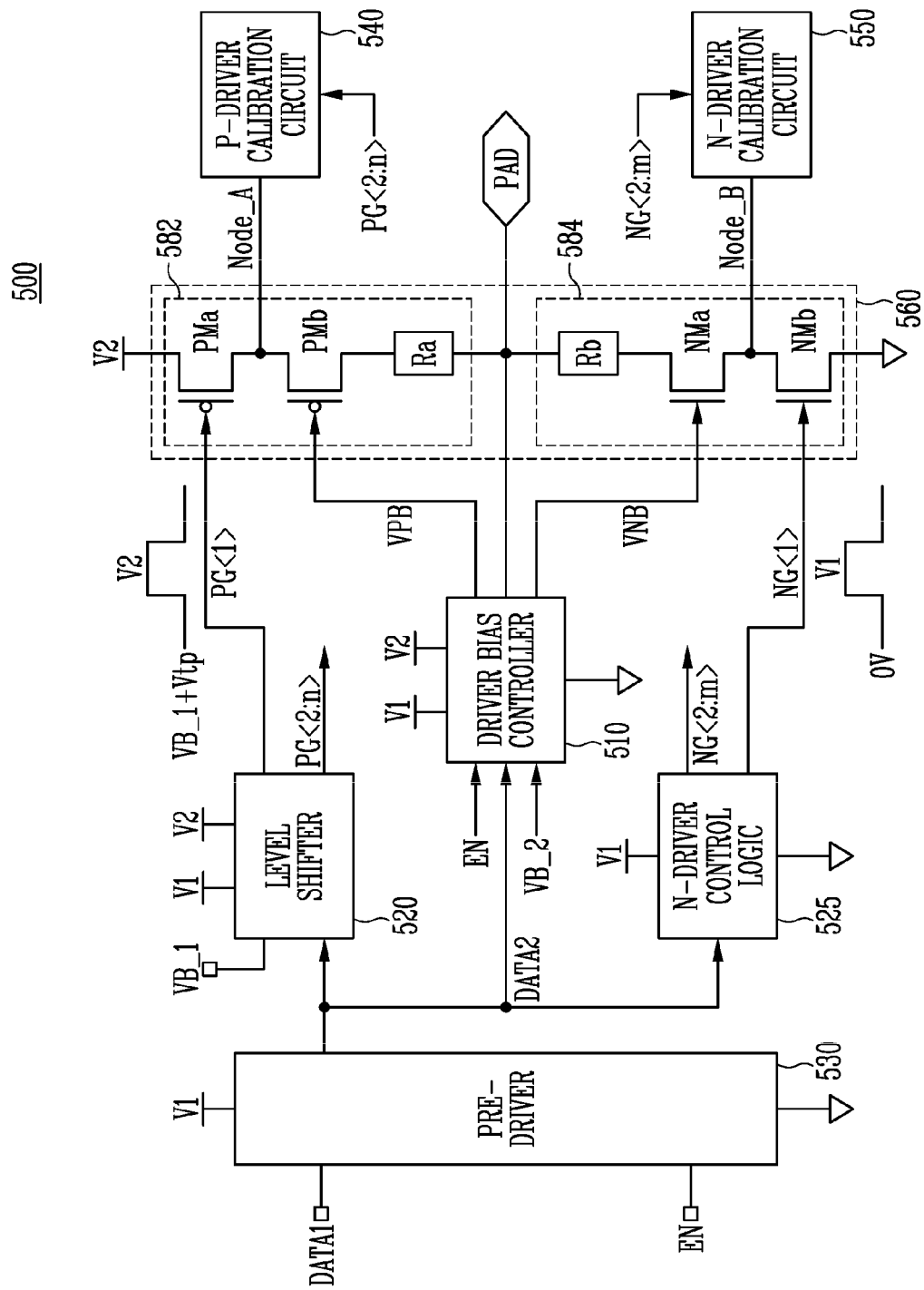
FIG. 6 is a block diagram illustrating an output driving circuit 500 according to still another embodiment of the present disclosure.

FIG. 6 is a block diagram illustrating an output driving circuit 500 according to still another embodiment of the present disclosure.

Referring to FIG. 6, the output driving circuit 500 includes a pre-driver 530, a level shifter 520, a driver control logic (e.g., an N-driver control logic) 525, a first driver calibration circuit (e.g., a P-driver calibration circuit) 540, a second driver calibration circuit (e.g., an N-driver calibration circuit) 550, a pull-up-pull-down driver (or a pull-up-down driver) 560, and a driver bias controller 510. The pull-up-down driver 560 includes a first PMOS transistor PMa, a second PMOS transistor PMb, a first NMOS transistor Nma, a second NMOS transistor NMb, a first resistor Ra, and a second resistor Rb. For example, the pull-up-pull-down driver 560 include a pull-up driver 582 and a pull-down driver 584, such that the pull-up driver 582 includes the first PMOS transistor PMa, the second PMOS transistor PMb, and the first resistor Ra, and the pull-down driver 584 includes the first NMOS transistor Nma, the second NMOS transistor NMb, and the second resistor Rb. In FIG. 6, the pre-driver 530, the level shifter 520, the N-driver control logic 525, the P-driver calibration circuit 540, and the N-driver calibration circuit 550 may be substantially the same as the pre-driver 330, the level shifter 320, the N-driver control logic 325, the P-driver calibration circuit 340, and the N-driver calibration circuit 350 shown in FIG. 4, respectively. Therefore, repetitive description of the pre-driver 530, the level shifter 520, the N-driver control logic 525, the P-driver calibration circuit 540, and the N-driver calibration circuit 550 is omitted.

The driver bias controller 510 may operate based on the first and second power voltages V1 and V2. In addition, the driver bias controller 510 may be connected to the pad and receive the enable signal EN, the second data signal DATA2, and the second bias voltage VB_2. The driver bias controller 510 generates a first bias voltage (e.g., a P-bias voltage) VPB and a second bias voltage (e.g., an N-bias voltage) VNB that change according to a pad state, based on one or more of the received signals. The P-bias voltage VPB is applied to the second PMOS transistor PMb of the pull-up-pull-down driver 560. The N-bias voltage VNB is applied to the first NMOS transistor NMa of the pull-up-pull-down driver 560. The driver bias controller 510 controls the P-bias voltage VPB to have a value between the second bias voltage VB_2 and the first power voltage V1, according to the state of the pad. As the P-bias voltage VPB has the value between the second bias voltage VB_2 and the first power voltage V1, when a voltage of the pad has a voltage value between 0V and the second power voltage V2, the reliability condition of the thin gate oxide device described through [Table 1] is satisfied during an operation of the second PMOS transistor PMb.

In addition, the driver bias controller 510 controls the N-bias voltage VNB to have a value between the first power voltage V1 and the second power voltage V2, according to the state of the pad. As the N-bias voltage VNB has the value between the first power voltage V1 and the second power voltage V2, when the voltage of the pad has a voltage value between 0V and the second power voltage V2, the reliability condition of the thin gate oxide device described through [Table 1] is satisfied during an operation of the first NMOS transistor NMa.

An embodiment of the driver bias controller 510 shown in FIG. 6 is described with reference to FIG. 7.

Figure 7:
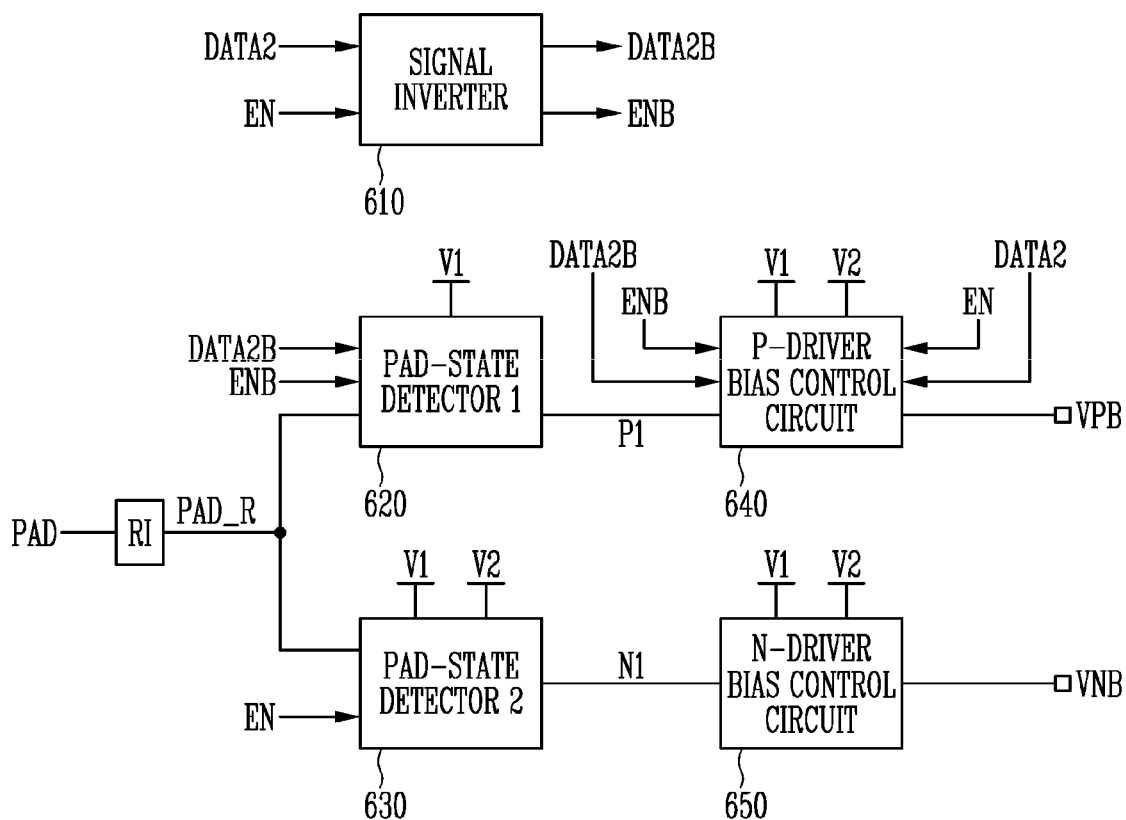
FIG. 7 is a block diagram illustrating a driver bias controller 600 according to an embodiment of the present disclosure.

FIG. 7 is a block diagram illustrating a driver bias controller 600 according to an embodiment of the present disclosure.

Referring to FIG. 7, the driver bias controller 600 includes a signal inverter 610, a first pad-state detector 620, a second pad-state detector 630, a P-driver bias control circuit 640, an N-driver bias control circuit 650, and an internal resistor RI. The internal resistor RI is connected to the pad. The P-driver bias control circuit 640 and the N-driver bias control circuit 650 are connected to the internal resistor RI.

The signal inverter 610 may receive the second data signal DATA2 and the enable signal EN to generate a second inverted data signal DATA2B and an inverted enable signal ENB. An example configuration of the signal inverter 610 is described later with reference to FIG. 8.

The first pad-state detector 620 detects a voltage state of the pad having a voltage between 0V and the second power voltage V2 through the internal resistance RI. More specifically, the voltage of the pad may be changed from a low voltage to a high voltage or from a high voltage to a low voltage, in a range of 0V to the second power voltage V2. The first pad-state detector 620 detects the voltage state of the pad, which is changed as described above, and outputs a detection result to a node P1. To this end, the first pad-state detector 620 operates based on the first power voltage V1 and receives the second inverted data signal DATA2B and the inverted enable signal ENB. A specific configuration of the first pad-state detector 620 is described with reference to FIG. 9.

The P-driver bias control circuit 640 is connected to the first pad-state detector 620 through the node P1. The P-driver bias control circuit 640 may operate based on the first power voltage V1 and the second bias voltage VB_2. In addition, the P-driver bias control circuit 640 receives the second data signal DATA2, the enable signal EN, the second inverted data signal DATA2B, and the inverted enable signal ENB. The P-driver bias control circuit 640 generates a P-bias voltage VPB according to the second inverted data signal DATA2B input based on the pad state detected by the first pad-state detector 620. A specific configuration of the P-driver bias control circuit 640 is described with reference to FIG. 10.

The second pad-state detector 630 detects the voltage state of the pad having the voltage between 0V and the second power voltage V2 through the internal resistor RI. More specifically, the voltage of the pad may be changed from a low voltage to a high voltage or from a high voltage to a low voltage in a range of 0V to the second power voltage V2. The second pad-state detector 630 detects the voltage state of the pad, which is changed as described above, and outputs the detection result to a node Ni. To this end, the second pad-state detector 630 operates based on the first and second power voltages V1 and V2, and receives the enable signal EN. In addition, although not shown in FIG. 7, the second pad-state detector 630 may receive the first PMOS gate signal PG<1> generated by the level shifter 520. A specific configuration of the second pad-state detector 630 is described with reference to FIG. 11.

The N-driver bias control circuit 650 is connected to the second pad-state detector 630 through the node Ni. The N-driver bias control circuit 650 generates an N-bias voltage VNB according to the pad state detected by the second pad-state detector 630. The N-driver bias control circuit 650 may operate based on the first and second power voltages V1 and V2. A specific configuration of the N-driver bias control circuit 650 is described with reference to FIG. 12.

Figure 8:
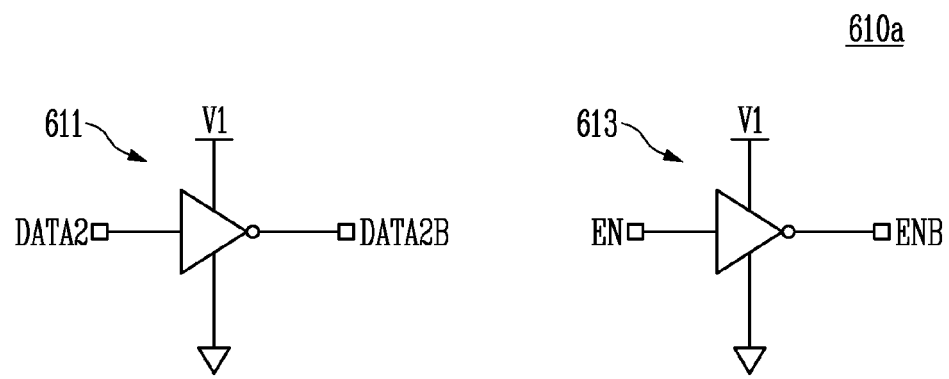
FIG. 8 is a diagram illustrating signal inverter 610 of FIG. 7 according to an embodiment of the present disclosure.

FIG. 8 is a diagram illustrating a signal inverter 610a suitable for use as the signal inverter 610 of FIG. 7, according to an embodiment. Referring to FIG. 8, the signal inverter 610a may include a plurality of inverters 611 and 613. The inverter 611 operates based on the first power voltage V1, and inverts the second data signal DATA2 to output the second inverted data signal DATA2B. The inverter 613 operates based on the first power voltage V1, and inverts the enable signal EN to output the inverted enable signal ENB. Since the plurality of inverters 611 and 613 operate based on the first power voltage V1, each of the second inverted data signal DATA2B and the inverted enable signal ENB may be signals having a voltage value between 0V and the first power voltage V1.

Figure 9:
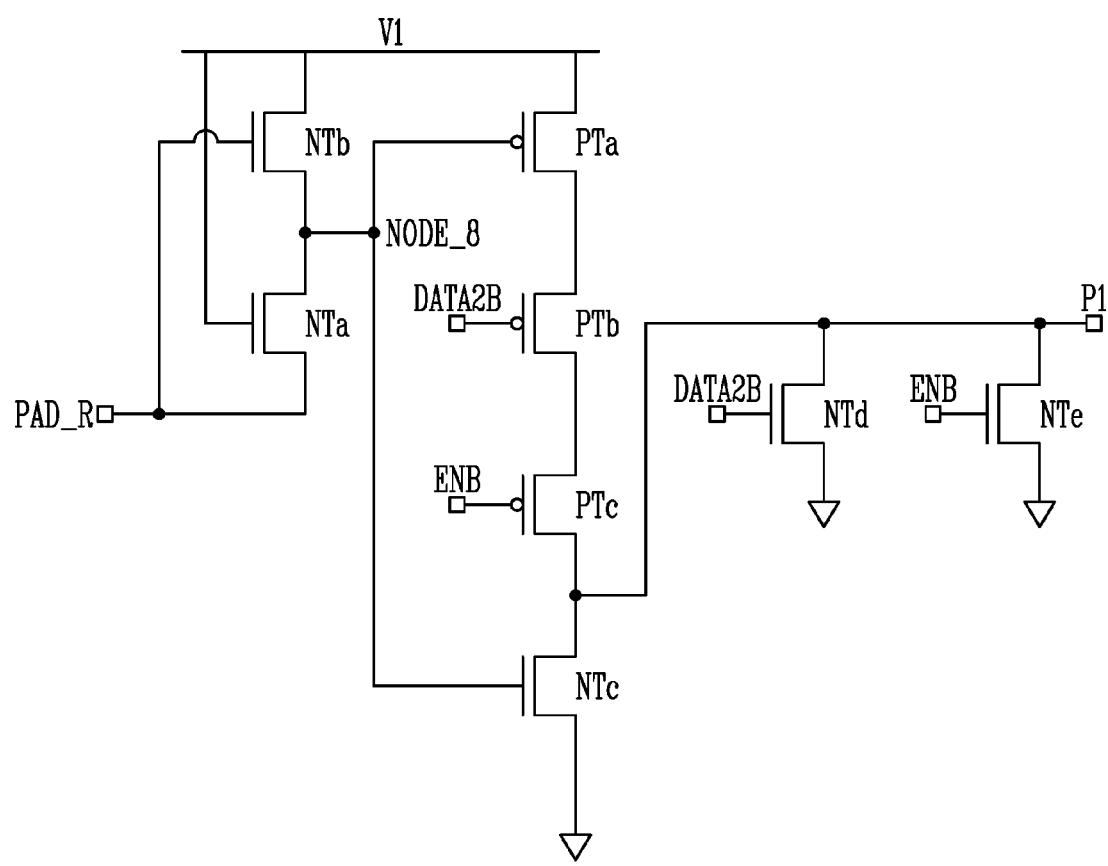
FIG. 9 is a diagram illustrating a first pad-state detector 620 of FIG. 7 according to an embodiment of the present disclosure.

FIG. 9 is a diagram illustrating a first pad-state detector 620a suitable for use as the first pad-state detector 620 of FIG. 7, according to an embodiment.

Referring to FIG. 9, the first pad-state detector 620 includes NMOS transistors NTa, NTb, NTc, NTd, and NTe and PMOS transistors PTa, PTb, and PTc. The NMOS transistors NTa and NTb are connected in series between the first power voltage V1 and a node PAD_R. The first pad-state detector 620 is connected to the resistor RI of FIG. 7 through the node PAD_R. In an embodiment, a voltage of the node PAD_R may be the same as the voltage of the pad. A gate of the NMOS transistor NTa is connected to the first power voltage V1, and a gate of the NMOS transistor NTb is connected to the node PAD_R. The NMOS transistor NTb is included to block a leakage current. When there is no NMOS transistor NTb, a voltage of a node Node_8 has a level value of the first power voltage V1—a threshold voltage $VT_{NM1}$ of the NMOS transistor NTa. In this case, since a voltage of $V1-VT_{NM1}$ is supplied to a gate of the PMOS transistor PTa or a gate of the NMOS transistor NTc, not the first power voltage V1, a leakage current path may be generated. When the NMOS transistor NTb is connected between the first power voltage V1 and the node NODE_8, the first power voltage V1 is completely supplied to the node NODE_8 to prevent an occurrence of the leakage current. In other words, since the NMOS transistor NTb is connected between the first power voltage V1 and the node NODE_8 as shown in FIG. 9, the voltage of the node NODE_8 may have a level substantially equal to the first power voltage V1, rather than $V1-VT_{NM1}$, thereby preventing an occurrence of the leakage current.

The PMOS transistors PTa, PTb, and PTc are connected in series between the first power voltage V1 and the node P1. The gate of the PMOS transistor PTa is connected to the node NODE_8. The second inverted data signal DATA2B is applied to the gate of the PMOS transistor PTb. The inverted enable signal ENB is applied to a gate of the PMOS transistor PTc.

When the enable signal EN is deactivated to a logic low, the inverted enable signal ENB is activated to a logic high. Therefore, in this case, the PMOS transistor PTc is turned off, and thus a voltage transfer path between the first power voltage V1 and the node P1 is blocked regardless of the second data signal DATA2.

The NMOS transistor NTc is connected between the node P1 and the ground. The gate of the NMOS transistor NTc is connected to the node NODE_8.

The NMOS transistors NTd and NTe are connected in parallel between the node P1 and the ground. The second inverted data signal DATA2B is applied to a gate of the NMOS transistor NTd. The inverted enable signal ENB is applied to a gate of the NMOS transistor NTe.

When the enable signal EN is deactivated to a logic low, the inverted enable signal ENB is activated to a logic high. Therefore, in this case, the NMOS transistor NTe is turned on, and thus the voltage of the node P1 maintains a low level regardless of the second data signal DATA2.

According to a circuit structure of FIG. 9, the voltage of the node P1 is determined according to the pad voltage and the second data signal DATA2. When the voltage of the pad PAD is a low voltage, for example, the ground voltage and a signal of the second inverted data signal DATA2B is a voltage of a logic high state, the PMOS transistor PTb is turned off and the NMOS transistor NTd is turned on, and thus the voltage of the node P1 becomes a logic low state.

The voltage state of the pad is the same as that of the second data signal DATA2, but some delay may occur between the two states. That is, when the second data signal DATA2 is changed from a logic low state to a logic high state, that is, when the second inverted data signal DATA2B is changed from a logic high state to a logic low state, the pad voltage maintains a logic low state during a certain time period from a time point of the change. In this period, this causes the voltage of the node P1 to be in a logic low state by the NMOS transistor NTd. The PMOS transistor PTb receiving the second inverted data signal DATA2B having a logic low state through the gate is turned on and the NMOS transistor NTd is turned off. Therefore, the voltage of the node P1 temporarily increases to the first power voltage V1. That is, the second inverted data signal DATA2B has a logic low state, the inverted enable signal ENB has a logic low state, and the pad voltage has a logic low state during a given time period, the PMOS transistors PTa, PTb, PTc are turned on and the NMOS transistors NTc, NTd, and NTe are turned off. As a result, the first power voltage V1 and the node P1 are coupled to increase the voltage of the node P1 substantially equal to the first power voltage V1. Subsequently, the pad voltage changes to a logic high state to turn on the NMOS transistor NTb, and thus the voltage of the node NODE_8 increases to turn on the NMOS transistor NTc, thereby coupling the node P1 to the ground. Accordingly, the voltage of the node P1 increases to the first power voltage V1 during the time period, and then decreases.

Figure 10:
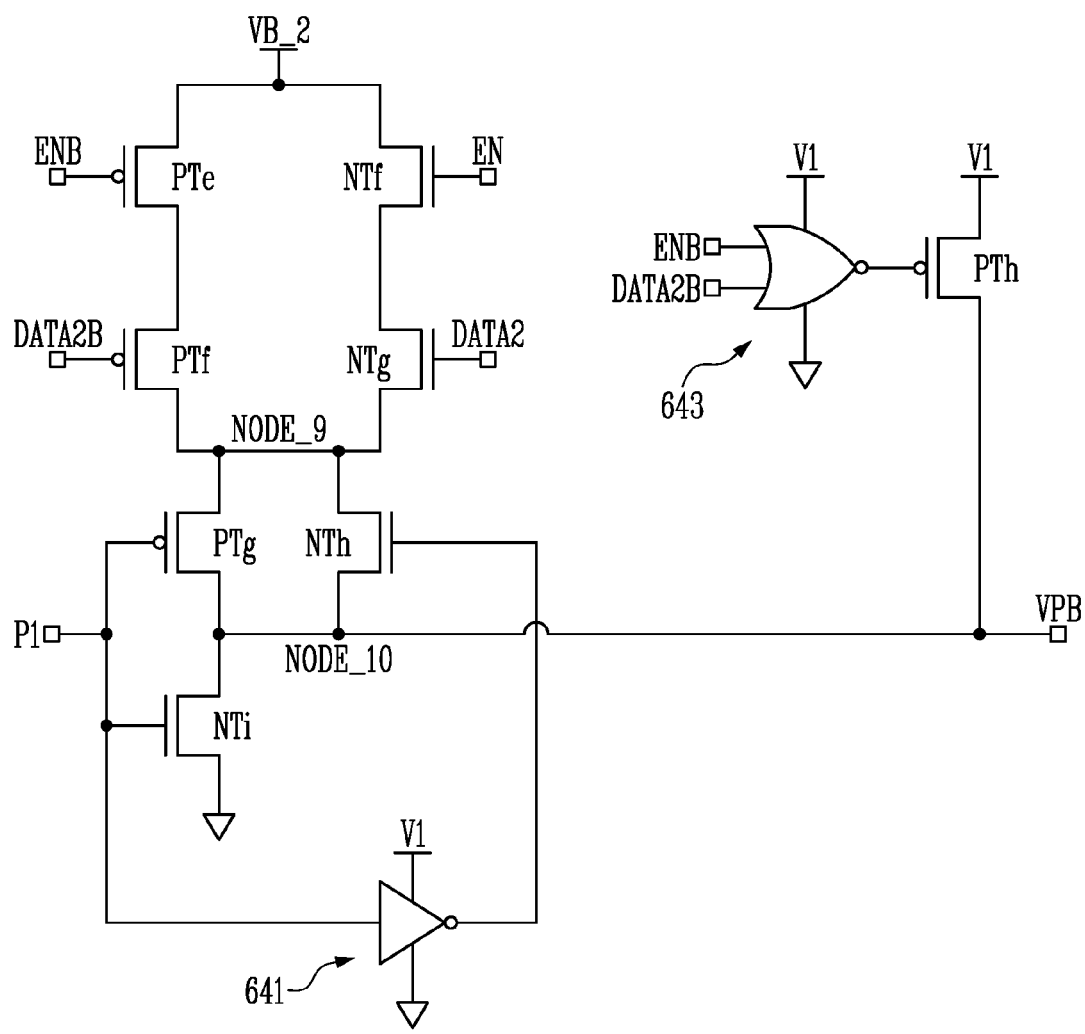
FIG. 10 is a diagram illustrating a P-driver bias control circuit 640 of FIG. 7 according to an embodiment of the present disclosure.

FIG. 10 is a diagram illustrating a P-driver bias control circuit 640a suitable for use as the P-driver bias control circuit 640 of FIG. 7, according to an embodiment. Referring to FIG. 10, the P-driver bias control circuit 640a may include NMOS transistors NTf, NTg, NTh, and NTi, PMOS transistors PTe, PTf, PTg, and PTh, an inverter 641, and a negative-OR gate (NOR gate) 643. The NMOS transistors NTf and NTg are connected in series between the second bias voltage VB_2 and a node NODE_9. The enable signal EN is applied to a gate of the NMOS transistor NTf, and the second data signal DATA2 is applied to a gate of the NMOS transistor NTg. The PMOS transistors PTe and PTf are connected in series between the second bias voltage VB_2 and the node NODE_9. The inverted enable signal ENB and the second inverted data signal DATA2B are applied to gate terminals of the PMOS transistors PTe and PTf, respectively.

The PMOS transistor PTg and the NMOS transistor NTh are connected in parallel between the node NODE_9 and a node NODE_10. The node NODE_10 may be directly connected to an output terminal of the P-driver bias control circuit 640. The P-bias voltage VPB is output through the output terminal of the P-driver bias control circuit 640. Meanwhile, the NMOS transistor NTi is connected between the node NODE_10 and the ground.

A gate terminal of the PMOS transistor PTg and a gate terminal of the NMOS transistor NTi are connected to the node P1. The node P1 may be an output node of the first pad-state detector 620. Meanwhile, an input terminal of the inverter 641 may be connected to the node P1, and an output terminal of the inverter 641 may be connected to the gate of the NMOS transistor NTh.

The NOR gate 643 performs an NOR operation on the inverted enable signal ENB and the second inverted data signal DATA2B, and output the operation result to the gate of the PMOS transistor PTh. The PMOS transistor PTh is connected between the first power voltage V1 and an output terminal VPB of the P-driver bias control circuit 640a. In a case of the NOR gate 643, an output of a logic-low is applied to the gate of the PMOS transistor PTh regardless of a level of the second inverted data signal DATA2B while the inverted enable signal ENB has a logic-high state. In this case, the PMOS transistor PTh is turned on to output the first power voltage V1 to the output terminal. At this time, the second PMOS transistor PMb shown in FIG. 6 is turned off.

When a voltage level of the node P1 is a low level, a voltage VPB of the output terminal becomes the first power voltage V1. In this state, when a voltage level of the second data signal DATA2 increases from a low level to a high level, the voltage of the node P1 temporarily increases to a level of the first power voltage V1. As the voltage level of the node P1 increases, the NMOS transistor NTi is turned on, and thus the P-bias voltage VPB output to the output terminal temporarily decreases to a low level, that is, the ground voltage level.

When the voltage VPB of the output terminal is the first power voltage V1, this voltage is applied to the gate of the second PMOS transistor PMb of FIG. 6. At this time, a source voltage of the second PMOS transistor PMb, that is, a voltage of the node NODE_A has a level of the first power voltage V1+a threshold voltage $VT_{PMb}$ of the second PMOS transistor PMb. Since a drain voltage of the second PMOS transistor PMb, that is, the voltage of the pad PAD is a low level, in a state in which the voltage of the pad PAD is not increased to the first power voltage V1 or more, even though the P-bias voltage VPB momentarily decreases to a low level, for example, 0V, the gate-source voltage VGS, the gate-drain voltage VGD, and the drain-source voltage VDS of the second PMOS transistor PMb are within the reliability range condition described through [Table 1].

Meanwhile, in a situation in which the voltage of the pad PAD increases to the first power voltage V1 or more, the voltage of the node P1 decreases again to a low level. At this time, the P-bias voltage VPB temporarily increases to the first power voltage V1 to satisfy the reliability condition of the second PMOS transistor PMb. Thereafter, the P-bias voltage VPB is changed to the second bias voltage VB_2 in a state in which the voltage of the pad PAD is stabilized to the second power voltage V2.

Accordingly, the first pad-state detector 620 and the P-driver bias control circuit 640 output the P-bias voltage VPB having a voltage value between the second bias voltage VB_2 and the first power voltage V1. Accordingly, the second PMOS transistor PMb may operate in a state that satisfies the reliability condition of [Table 1].

Figure 11:
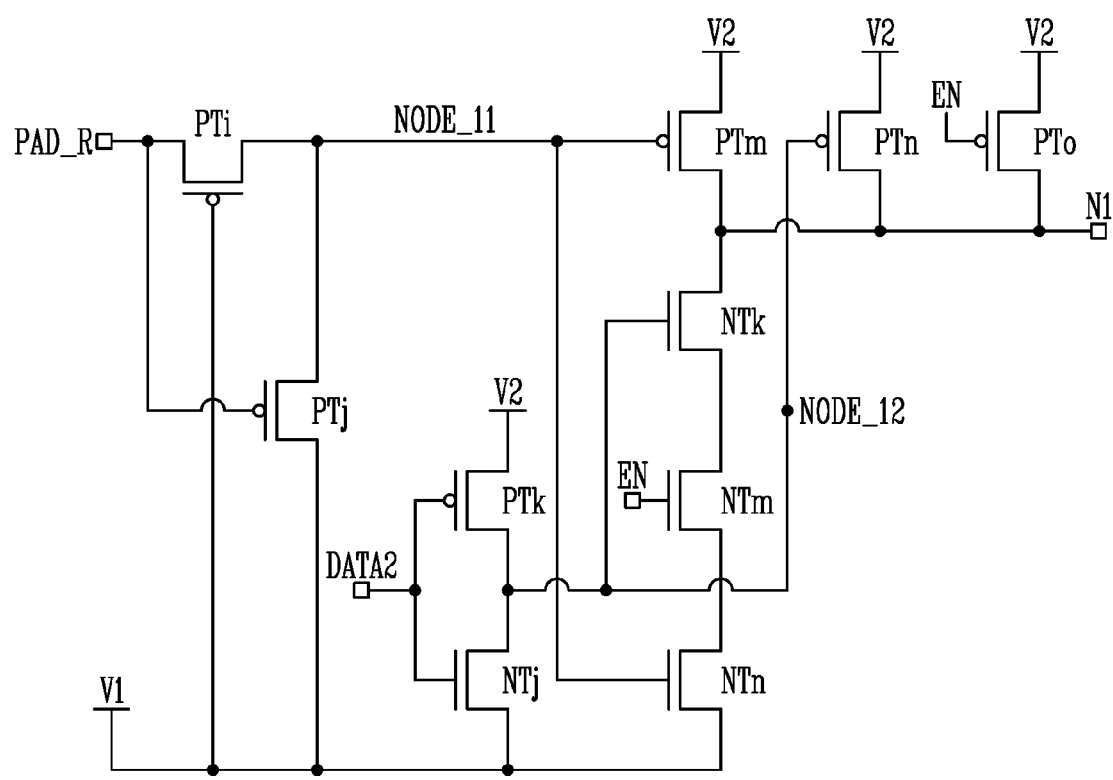
FIG. 11 is a diagram illustrating a second pad-state detector 630 of FIG. 7 according to an embodiment of the present disclosure.

FIG. 11 is a diagram illustrating a second pad-state detector 630a suitable for use as the second pad-state detector 630 of FIG. 7, according to an embodiment.

Referring to FIG. 11, the second pad-state detector 630a may include NMOS transistors NTj, NTk, NTm, and NTn, and PMOS transistors PTi, PTj, PTk, PTm, PTn, and PTo.

The PMOS transistor PTi is connected between the node PAD_R and a node NODE_11. A gate of the PMOS transistor PTi is connected to the first power voltage V1. The PMOS transistor PTj is connected between the node NODE_11 and the first power voltage V1. A gate of the PMOS transistor PTj is connected to the node PAD_R. The PMOS transistor PTk and the NMOS transistor NTj are connected in series between the second power voltage V2 and the first power voltage V1. Gates of the PMOS transistor PTk and the NMOS transistor NTj are connected to the first PMOS gate signal PG<1>. The PMOS transistor PTm is connected between the second power voltage V2 and the node Ni. A gate of the PMOS transistor PTm is connected to the node NODE_11. The NMOS transistors NTk, NTm, and NTn are connected in series between the node N1 and the first power voltage V1. A gate of the NMOS transistor NTk is connected to a node NODE_12. The enable signal EN is applied to a gate of the NMOS transistor NTm. The node NODE_11 is connected to a gate of the NMOS transistor NTn.

The PMOS transistors PTn and PTo are connected in parallel between the second power voltage V2 and the node Ni. A gate of the PMOS transistor PTn is connected to a node NODE_12. A gate of the PMOS transistor PTo is connected to the enable signal EN.

When the second data signal DATA2 has a low level voltage value, and thus, the voltage of the pad PAD is 0V, the PMOS transistor PTk may be turned on by the second data signal DATA2 of a low state. Accordingly, a voltage of the node NODE_12 becomes a level of the second power voltage V2. When the voltage of the pad PAD increases to a high level, for example, the level of the second power voltage V2, the NMOS transistor NTj may be turned on by the second data signal DATA2 of a high state. Accordingly, the voltage of the node NODE_12 becomes a level of the first power voltage V1.

When the voltage of the pad PAD is changed from a high level to a low level, due to a delay time between the voltage of the pad PAD and the second data signal DATA2, a voltage level of the node NODE_12 temporarily decreases from the second power voltage V2 to the first power voltage V1.

In addition, when the enable signal EN is activated to a high level, an inverter configured of the PMOS transistor PTm and the NMOS transistor NTk, NTm, and NTn is activated. In this case, the voltage of the node NODE_12 is changed according to the voltage of the pad PAD and the node PAD_R. When the enable signal EN is deactivated to a low level, the inverter configured of the PMOS transistor PTm and the NMOS transistors NTk, NTm, and NTn is deactivated, and the voltage of the node N1 is fixed to the second power voltage V2 by the PMOS transistor PTo.

Figure 12:
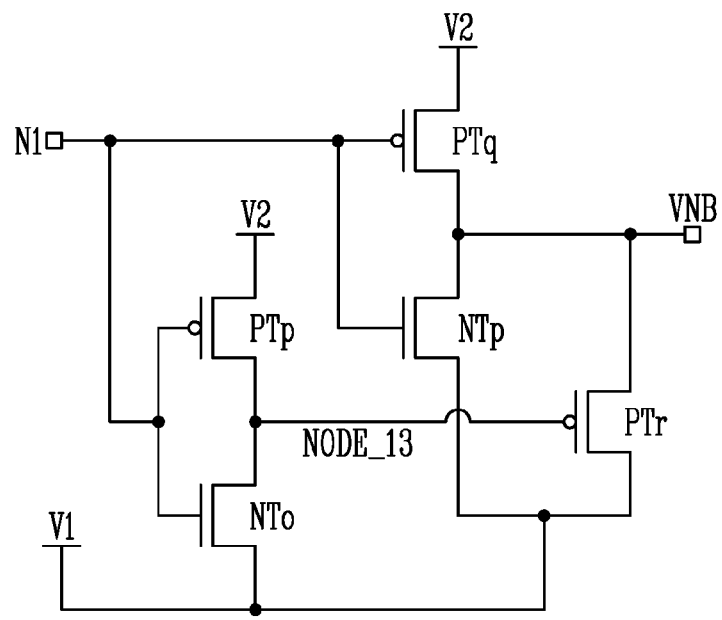
FIG. 12 is a diagram illustrating an N-driver bias control circuit 650 of FIG. 7 according to an embodiment of the present disclosure.

FIG. 12 is a diagram illustrating an N-driver bias control circuit 650a suitable for used as the N-driver bias control circuit 650 of FIG. 7, according to an embodiment. Referring to FIG. 12, the N-driver bias control circuit 650a includes NMOS transistors NTo and NTp and PMOS transistors PTp, PTq, and PTr.

The PMOS transistor PTp and the NMOS transistor NTo are connected between the second power voltage V2 and the first power voltage V1. Gates of the PMOS transistor PTp and the NMOS transistor NTo are connected to the node N1. The PMOS transistor PTp and the NMOS transistor NTo are connected to each other through a node NODE_13.

Meanwhile, the PMOS transistor PTq and the NMOS transistor NTp are connected between the second power voltage V2 and the first power voltage V1. Gates of the PMOS transistor PTq and the NMOS transistor NTp are connected to the node Ni. The PMOS transistor PTq and the NMOS transistor NTp are connected to each other by a node outputting the N-bias voltage VNB.

The PMOS transistor PTr is connected between the node outputting the N-bias voltage VNB and the first power voltage V1. A gate of the PMOS transistor PTr is connected to the node NODE_13.

When a voltage level of the node Ni as the input terminal is the second power voltage V2, the N-bias voltage VNB becomes the level of the first power voltage V1 by the NMOS transistor NTp. When the voltage of the node N1 temporarily decreases from the second power voltage V2 to the first power voltage V1 due to a delay between the voltage of the pad PAD and the second data signal DATA2, the N-bias voltage VNB is temporarily increased to the second power voltage V2.

Accordingly, the second pad-state detector 630 and the N-driver bias control circuit 650 output the N-bias voltage VNB having a voltage value between the first power voltage V1 and the second power voltage V2. Thus, the first NMOS transistor NMa may operate in a state that satisfies the reliability condition of [Table 1].

What is claimed is:

1. An output driving circuit comprising:
a pull-up-pull-down driver connected to a pad;
a level shifter operating based on a first power voltage and a second power voltage that is greater than the first power voltage, level shifting a data signal to generate a first control signal, and applying the first control signal to the pull-up-pull-down driver; and
a driver control logic operating based on the first power voltage, generating a second control signal based on the data signal, and applying the second control signal to the pull-up-pull-down driver,
wherein the level shifter comprises:
a compensation voltage generator connected to a power terminal for receiving the second power voltage and configured to generate a compensation voltage;
an output voltage compensator connected to the power terminal for receiving the second power voltage and configured to adjust a voltage level of an output terminal of the level shifter according to the compensation voltage;
a current mirror receiving the data signal according to the first power voltage and mirroring a current corresponding to the second power voltage according to a level of the data signal to generate the first control signal;
a first adjustment circuit connected to an output terminal of the current mirror and configured to adjust a voltage level of the output terminal of the current mirror according to a first bias voltage, the first bias voltage being less than the second power voltage;
a second adjustment circuit including the compensation voltage generator and the output voltage compensator which are connected in parallel with the current mirror and configured to adjust the voltage level of the output terminal of the current mirror; and
a third adjustment circuit configured to adjust a voltage level of first and second current paths of the current mirror according to the first power voltage and configured to block a current of the second current path of the current mirror according to the data signal.

2. The output driving circuit of claim 1, wherein the pull-up-pull-down driver comprises:
a pull-up driver connected in series between the second power voltage and the pad and receiving the first control signal and a second bias voltage; and
a pull-down driver connected between the pad and a ground and receiving the second control signal and the first power voltage.

3. The output driving circuit of claim 2, wherein the pull-up driver comprises:
a first PMOS transistor connected to the second power voltage and receiving the first control signal;
a second PMOS transistor connected to the first PMOS transistor through a first node and receiving the second bias voltage; and
a first resistor connected between the second PMOS transistor and the pad.

4. The output driving circuit of claim 3, further comprising:
a P-driver calibration circuit connected to the first node and calibrating an impedance of the first node,
wherein the level shifter generates a calibration control signal for controlling the P-driver calibration circuit.

5. The output driving circuit of claim 2, wherein the pull-down driver comprises:
a second resistor connected to the pad;
a first NMOS transistor connected to the second resistor and receiving the first power voltage; and a second NMOS transistor connected to the first NMOS transistor through a second node and receiving the second control signal.

6. The output driving circuit of claim 5, further comprising:
an N-driver calibration circuit connected to the second node and calibrating an impedance of the second node,
wherein the driver control logic generates a calibration control signal for controlling the N-driver calibration circuit.

7. The output driving circuit of claim 1, further comprising:
a driver bias controller for controlling the pull-up-pull-down driver based on a pad voltage received through the pad and a second bias voltage,
wherein the driver bias controller comprises a pad-state detector detecting a voltage state of the pad through an internal resistor and outputting a detection result to an output node.

8. The output driving circuit of claim 7, wherein the driver bias controller outputs a P-bias voltage and an N-bias voltage,
wherein the P-bias voltage has a voltage value between the second bias voltage and the first power voltage, and
wherein the N-bias voltage has a voltage value between the first power voltage and the second power voltage.

9. The output driving circuit of claim 8, wherein the pull-up-pull-down driver comprises:
a pull-up driver connected in series between the second power voltage and the pad and receiving the first control signal and the P-bias voltage; and
a pull-down driver connected between the pad and a ground and receiving the second control signal and the N-bias voltage.

10. The output driving circuit of claim 9, wherein the pull-up driver comprises:
a first PMOS transistor connected to the second power voltage and receiving the first control signal;
a second PMOS transistor connected to the first PMOS transistor through a first node and receiving the P-bias voltage; and
a first resistor connected between the second PMOS transistor and the pad.

11. The output driving circuit of claim 9, wherein the pull-down driver comprises:
a second resistor connected to the pad;
a first NMOS transistor connected to the second resistor and receiving the N-bias voltage; and
a second NMOS transistor connected to the first NMOS transistor through a second node and receiving the second control signal.

12. The output driving circuit of claim 8, wherein the driver bias controller further comprises:
a P-driver bias control circuit generating the P-bias voltage based on the detection result.

13. The output driving circuit of claim 12, wherein the pad-state detector comprises:
a first NMOS transistor connected between the first power voltage and a first node;
a second NMOS transistor connected between the first node and the internal resistor;
first, second, and third PMOS transistors connected in series between the first power voltage and the output node; and
third, fourth, and fifth NMOS transistors connected in parallel between the output node and a ground,
wherein a gate of the first NMOS transistor is connected to the internal resistor,
wherein a gate of the second NMOS transistor is connected to the first power voltage,
wherein a gate of the third NMOS transistor is connected to the first node,
wherein an inverted data signal is input to a gate of the fourth NMOS transistor, the inverted data signal being an inverted version of the data signal,
wherein an inverted enable signal is input to a gate of the fifth NMOS transistor, the inverted enable signal being an inverted version of an enable signal,
wherein a gate of the first PMOS transistor is connected to the first node,
wherein the inverted data signal is input to a gate of the second PMOS transistor, and
wherein the inverted enable signal is input to a gate of the third PMOS transistor.

14. The output driving circuit of claim 13, wherein the P-driver bias control circuit comprises:
fourth and fifth PMOS transistors connected in series between the second bias voltage and a second node;
sixth and seventh NMOS transistors connected in series between the second bias voltage and the second node;
a sixth PMOS transistor and an eighth NMOS transistor connected in parallel between the second node and a third node;
a ninth NMOS transistor connected between the third node and the ground;
a seventh PMOS transistor connected between the first power voltage and the third node;
an inverter receiving a voltage of the output node as an input; and
a negative OR (NOR) gate receiving the inverted enable signal and the inverted data signal,
wherein the inverted enable signal is input to a gate of the fourth PMOS transistor,
wherein the inverted data signal is input to a gate of the fifth PMOS transistor,
wherein the enable signal is input to a gate of the sixth NMOS transistor,
wherein the data signal is input to a gate of the seventh NMOS transistor,
wherein gates of the sixth PMOS transistor and the ninth NMOS transistor are connected to the output node,
wherein a gate of the eighth NMOS transistor is connected to an output terminal of the inverter, and
wherein an output terminal of the NOR gate is connected to a gate of the seventh PMOS transistor.

15. The output driving circuit of claim 8, wherein the driver bias controller further comprises:
an N-driver bias control circuit generating the N-bias voltage based on the detection result.

16. The output driving circuit of claim 15, wherein the pad-state detector comprises:
a first PMOS transistor connected between the internal resistor and a first node;
a second PMOS transistor connected between the first node and the first power voltage;
a third PMOS transistor and a first NMOS transistor connected in series between the second power voltage and the first power voltage;
second, third, and fourth NMOS transistors connected in series between the output node and the first power voltage; and fourth, fifth, and sixth PMOS transistors connected in parallel between the second power voltage and the output node,
wherein a gate of the first PMOS transistor is connected to the first power voltage,
wherein a gate of the second PMOS transistor is connected to the internal resistor,
wherein the third PMOS transistor and the first NMOS transistor are connected to each other through a second node, and the data signal is input to gates of the third PMOS transistor and the first NMOS transistor,
wherein gates of the second NMOS transistor and the fifth PMOS transistor are connected to the second node,
wherein an enable signal is applied to gates of the third NMOS transistor and the sixth PMOS transistor, and
wherein gates of the fourth NMOS transistor and the fourth PMOS transistor are connected to the first node.

17. The output driving circuit of claim 16, wherein the N-driver bias control circuit comprises:
a seventh PMOS transistor and a fifth NMOS transistor connected in series between the second power voltage and the first power voltage;
an eighth PMOS transistor and a sixth NMOS transistor connected in series between the second power voltage and the first power voltage; and
a ninth PMOS transistor connected between a third node and the first power voltage,
wherein the seventh PMOS transistor and the fifth NMOS transistor are connected to each other through a fourth node, the eighth PMOS transistor and the sixth NMOS transistor are connected to each other through the third node,
wherein gates of the seventh and eighth PMOS transistors and the fifth and sixth NMOS transistors are connected to the output node, and a gate of the ninth PMOS transistor is connected to the fourth node.

18. The output driving circuit of claim 1, wherein the pull-up-pull-down driver comprises:
a first transistor having a first end terminal, a second end terminal, and a control terminal, the first terminal being connected to the second voltage and the control terminal receiving the first control signal; and
a second transistor having a first end terminal, a second end terminal, and a control terminal, the second end terminal being connected to a ground and the control terminal receiving the second control signal,
wherein the first control signal has a first value sufficient to keep a voltage difference between the control terminal and the first end terminal of the first transistor, a voltage difference between the control terminal and the second end terminal of the first transistor, and a voltage difference between the second end terminal and the first end terminal of the first transistor equal to or less than a given value, and
wherein the second control signal has a second value sufficient to keep a voltage difference between the control terminal and the first end terminal of the second transistor, a voltage difference between the control terminal and the second end terminal of the second transistor, and a voltage difference between the second end terminal and the first end terminal of the second transistor equal to or less than the given value.

19. The output driving circuit of claim 18, wherein the pull-up-pull-down driver further comprises:
a third transistor having a first end terminal, a second end terminal, and a control terminal, the first terminal of the third transistor being connected to the second end of the first transistor, the second terminal of the third transistor being connected to the pad, the control terminal of the third transistor receiving a second bias voltage; and
a fourth transistor having a first end terminal, a second end terminal, and a control terminal, the first terminal of the fourth transistor being connected to the pad, the second terminal of the fourth transistor being connected to the first terminal of the second transistor, the control terminal of the fourth transistor receiving a third bias voltage,
wherein the second bias voltage has a third value sufficient to keep a voltage difference between the control terminal and the first end terminal of the third transistor, a voltage difference between the control terminal and the second end terminal of the third transistor, and a voltage difference between the second end terminal and the first end terminal of the third transistor equal to or less than the given value, and
wherein the third bias voltage has a fourth value sufficient to keep a voltage difference between the control terminal and the first end terminal of the fourth transistor, a voltage difference between the control terminal and the second end terminal of the fourth transistor, and a voltage difference between the second end terminal and the first end terminal of the fourth transistor equal to or less than the given value.

* * * * *